(12) United States Patent  
Olson

(10) Patent No.: US 6,247,635 B1
(45) Date of Patent: Jun. 19, 2001

(54) HIGH DENSITY CONNECTOR HAVING A BALL TYPE OF CONTACT SURFACE

(75) Inventor: Stanley W. Olson, East Berlin, PA (US)

(73) Assignee: Berg Technology, Inc.

(*) Notice: Subject to any disclaimer, the term of this patent is extended or adjusted under 35 U.S.C. 154(b) by 0 days.

(21) Appl. No.: 09/564,760

(22) Filed: May 4, 2000

Related U.S. Application Data

(62) Division of application No. 08/851,165, filed on May 2, 1997, now Pat. No. 6,139,336.
(60) Provisional application No. 60/030,799, filed on Nov. 14, 1996.

(51) Int. Cl.$^7$ .............................. B23K 1/20; B23K 31/02
(52) U.S. Cl. ..................... 228/118; 228/246; 228/133; 228/180.22
(58) Field of Search .................... 228/118, 133, 228/180.21, 246, 180.22, 180.1; 439/83, 79, 326; 438/108; 257/737, 738, 778; 361/760, 761, 803

(56) References Cited

U.S. PATENT DOCUMENTS

| 3,320,658 | 5/1967 | Bolda et al. . |
| 3,599,326 | * 8/1971 | DiRenzo . |
| 3,719,981 | 3/1973 | Steltz . |

(List continued on next page.)

FOREIGN PATENT DOCUMENTS

| 0 043 778 | 1/1982 | (EP) . |
| 0 591 772 A1 | 4/1994 | (EP) . |
| 0 836 243 A2 | 4/1998 | (EP) . |
| 60-072663 | 4/1985 | (JP) . |
| 0278893 | 11/1990 | (JP) . |
| 06203896 | 7/1994 | (JP) . |
| 96/42123 | 12/1996 | (WO) . |
| 97/20454 | 6/1997 | (WO) . |
| 98/15989 | 4/1998 | (WO) . |
| 98/15990 | 4/1998 | (WO) . |

Primary Examiner—Patrick Ryan
Assistant Examiner—Jonathan Johnson
(74) Attorney, Agent, or Firm—Steven M. Reiss; M. Richard Page

(57) ABSTRACT

A connector for use with a circuit substrate having a plurality of elongated conductors. A solder ball is fused to the end of the conductors for connection of the connector to a circuit substrate. Method for attaching the solder ball to the end of the conductors using a solder paste with or without a preformed solder ball. The conductors are fitted into passages of an interface member. A tail end of each conductor terminates in a well in a surface of the interface member that facilitates the attachment of solder ball to the end of the conductors. The passages in the interface member hold the conductor tail ends in place while providing a clearance around the conductor to accommodate the effects of thermal expansion and contraction.

15 Claims, 5 Drawing Sheets

U.S. PATENT DOCUMENTS

| | | |
|---|---|---|
| 3,838,382 | 9/1974 | Sugar . |
| 3,864,004 | 2/1975 | Friend . |
| 3,889,364 | 6/1975 | Krueger . |
| 4,056,302 | 11/1977 | Braun et al. . |
| 4,097,266 | 6/1978 | Takahaski et al. . |
| 4,380,518 | 4/1983 | Wydro . |
| 4,396,140 | 8/1983 | Jaffe et al. . |
| 4,421,266 * | 12/1983 | Bock . |
| 4,462,534 | 7/1984 | Bitaillou et al. . |
| 4,641,426 | 2/1987 | Hartman et al. . |
| 4,664,309 | 5/1987 | Allen et al. . |
| 4,678,250 | 7/1987 | Romine et al. . |
| 4,705,205 | 11/1987 | Allen et al. . |
| 4,722,470 | 2/1988 | Johary . |
| 4,767,344 | 8/1988 | Noschese . |
| 4,802,862 | 2/1989 | Seidler . |
| 4,830,264 | 5/1989 | Bitalilloou . |
| 4,841,101 * | 6/1989 | Pollock . |
| 4,871,110 | 10/1989 | Fukasawa et al. . |
| 4,884,335 | 12/1989 | McCoy et al. . |
| 4,986,462 | 1/1991 | Hethcoat . |
| 5,024,372 | 6/1991 | Altman et al. . |
| 5,060,844 | 10/1991 | Behun et al. . |
| 5,093,986 | 3/1992 | Mandal et al. . |
| 5,111,991 | 5/1992 | Clawson et al. . |
| 5,118,027 | 6/1992 | Braun et al. . |
| 5,129,573 * | 7/1992 | Duffey . |
| 5,145,104 | 9/1992 | Apap et al. . |
| 5,203,075 | 4/1993 | Angulas et al. . |
| 5,207,372 | 5/1993 | Funari et al. . |
| 5,222,649 | 6/1993 | Funari et al. . |
| 5,229,016 | 7/1993 | Hayes et al. . |
| 5,244,143 | 9/1993 | Ference et al. . |
| 5,255,839 | 10/1993 | Alves et al. . |
| 5,261,155 | 11/1993 | Angulas et al. . |
| 5,269,453 | 12/1993 | Melton et al. . |
| 5,275,330 | 1/1994 | Isaacs et al. . |
| 5,284,287 | 2/1994 | Wilson et al. . |
| 5,324,569 | 6/1994 | Nagesh et al. . |
| 5,334,046 | 8/1994 | Brouillette et al. . |
| 5,346,118 | 9/1994 | Degani et al. . |
| 5,355,283 | 10/1994 | Marrs et al. . |
| 5,358,417 | 10/1994 | Schmedding . |
| 5,377,902 | 1/1995 | Hayes . |
| 5,387,139 | 2/1995 | McKee et al. . |
| 5,395,250 | 3/1995 | Engleert, Jr. et al. . |
| 5,409,157 | 4/1995 | Nagesh et al. . |
| 5,410,807 * | 5/1995 | Bross et al. . |
| 5,431,332 | 7/1995 | Kirby et al. . |
| 5,435,482 | 7/1995 | Variot et al. . |
| 5,442,852 | 8/1995 | Danner . |
| 5,445,313 | 8/1995 | Boyd et al. . |
| 5,453,017 | 9/1995 | Belopolsky . |
| 5,467,913 | 11/1995 | Namekawa et al. . |
| 5,477,933 | 12/1995 | Nguyen . |
| 5,489,750 | 2/1996 | Sakemi et al. . |
| 5,491,303 | 2/1996 | Weiss . |
| 5,492,266 | 2/1996 | Hoebener et al. . |
| 5,495,668 | 3/1996 | Furusawa et al. . |
| 5,498,167 | 3/1996 | Seto et al. . |
| 5,499,487 | 3/1996 | McGill . |
| 5,504,277 | 4/1996 | Danner . |
| 5,516,030 | 5/1996 | Denton . |
| 5,516,032 | 5/1996 | Sakemi et al. . |
| 5,518,410 | 5/1996 | Masami . |
| 5,519,580 | 5/1996 | Natarajan et al. . |
| 5,534,127 | 7/1996 | Sakai . |
| 5,539,153 | 7/1996 | Schwiebert et al. . |
| 5,542,174 | 8/1996 | Chiu . |
| 5,577,657 * | 11/1996 | Glovatsky . |
| 5,591,049 | 1/1997 | Dohnishi . |
| 5,591,941 | 1/1997 | Acocella et al. . |
| 5,593,322 | 1/1997 | Swamy et al. . |
| 5,613,882 | 3/1997 | Hnatuck et al. . |
| 5,643,009 | 7/1997 | Dindel et al. . |
| 5,692,912 | 12/1997 | Nelson et al. . |
| 5,702,255 | 12/1997 | Murphy et al. . |
| 5,718,607 | 2/1998 | Murphy et al. . |
| 5,730,606 | 3/1998 | Sinclair . |
| 5,746,608 | 5/1998 | Taylor . |
| 5,772,451 | 6/1998 | Dozler, II et al. . |
| 6,139,336 | 10/2000 | Olson .................................. 439/83 |

* cited by examiner

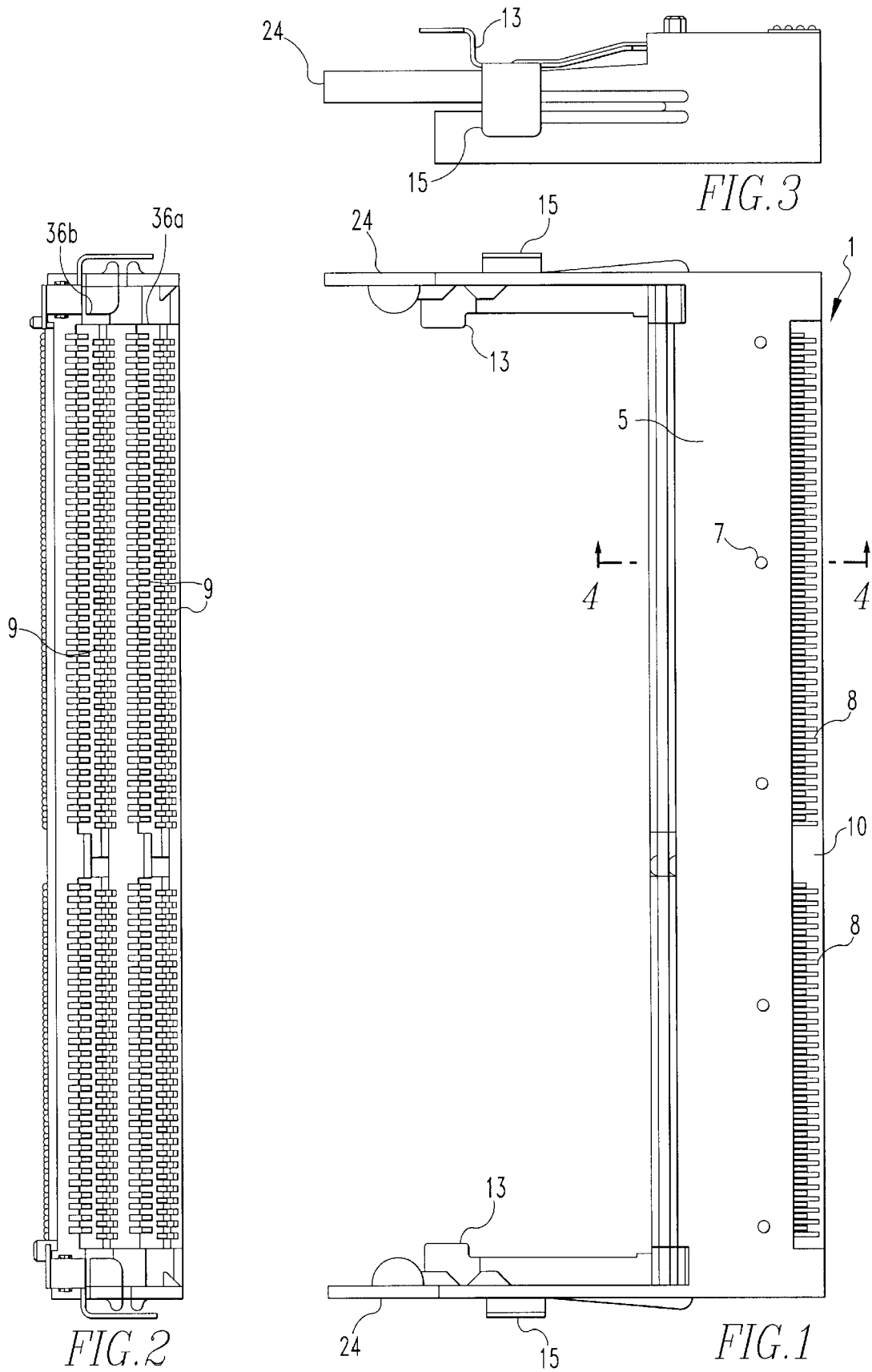

HIGH DENSITY CONNECTOR HAVING A BALL TYPE OF CONTACT SURFACE

CROSS-REFERENCE TO RELATED APPLICATIONS

This application is a divisional of U.S. patent application Ser. No. 08/851,165, filed May 02, 1997 and now U.S. Pat. No. 6,139,336, which claims the benefit of U.S. Provisional Patent application Ser. No. 60/030,799, filed Nov. 14, 1996 and entitled "BALL GRID ARRAY HIGH DENSITY CONNECTOR," both of which are herein incorporated by reference.

BACKGROUND OF THE INVENTION

1. Field of the Invention

The present invention relates to electrical connectors and more particularly to high I/O density connectors such as connectors that are attachable to a circuit substrate by use of a solder ball contact surface.

2. Brief Description of Earlier Developments

The drive to reduce the size of electronic equipment, particularly personal portable devices, and to add additional functions to such equipment has resulted in an ongoing drive for miniaturization of all components, especially electrical connectors. Efforts to miniaturize electrical connectors have included reductions in the pitch between terminals in single or double row linear connectors, so that a relatively high number of I/O or other lines can be interconnected by connectors that fit within the tightly circumscribed areas on circuit substrates that are allotted for receiving connectors. The drive for miniaturization has also been accompanied by a shift in manufacturing preference to surface mount techniques (SMT) for mounting components on circuit substrates. The confluence of the increasing use of SMT and the required fine pitch of linear connectors has resulted in approaching the high volume, low cost limits of SMT for mounting connectors that employ presently available mounting designs. The limit is being reached because further reductions in pitch of the terminals greatly increase the risk of bridging adjacent solder pads or terminals during reflow of the solder paste. Array electrical connectors have been proposed to satisfy the need for increased I/O density. Such electrical connectors have a two dimensional array of terminal tails and can provide improved density. However, these connectors present certain difficulties with respect to attachment to the circuit substrate by SMT techniques because the surface mount tails of most, if not all, of the terminals must be attached beneath the connector body. As a result, the mounting techniques used must be highly reliable because of the difficulty in visually inspecting the solder connections and repairing them, if faulty.

Mounting techniques for other electronic components have addressed the reliability of solder connections in hard to inspect positions. For example, integrated circuit (IC) mounting to plastic or ceramic substrates have increasingly employed solder balls and other similar packages to provide such a reliable attachment. In a solder ball technique, spherical solder balls attached to the IC package are positioned on electrical contact pads of a circuit substrate to which a layer of solder paste has been applied, typically by use of a screen or mask. The unit is then heated to a temperature at which the solder paste and at least a portion of the solder ball melt and fuse to an underlying conductive pad formed on the circuit substrate. This heating process is commonly referred to as solder reflow. The IC is thereby connected to the substrate without need of external leads on the IC.

While the use of solder balls and similar systems in connecting ICs to a substrate has many advantages, a corresponding means for mounting an electrical connector or similar component on a circuit substrate has recently become desirable. The use of such techniques in mounting electrical connectors has lagged the use in mounting ICs because the use of solder ball technologies in mounting an electrical connector or similar component to a circuit substrate presents complexities not encountered with IC mounting. For example, ICs that have employed solder balls generally present a flat attachment surface. By contrast, connectors usually do not present a flat attachment surface but rather present a series of elongated conductors, commonly referred to as terminal tail ends. Attachment of a solder ball to the small end surface presented by the tip of a terminal tail end presents manufacturing difficulties not present in the attachment of solder balls to a flat surface.

In addition to the manufacturing difficulties, connectors are generally more susceptible to solder joint stress due to the effects of differential Coefficients of Thermal Expansion (CTE) between the connector and the circuit substrate. This susceptibility is primarily due to size and geometry differences between a connector and an IC. For example, IC mounting surfaces are generally on the order of 2.5 centimeters square. Connector mounting surfaces, on the other hand, generally have a narrow width (e.g., 0.5 centimeters or less) and a much longer length (e.g. 5.0 centimeters or more). Primarily because of the relatively long length of the connector, differences in CTE between a connector and a circuit substrate potentially have a much greater effect on the solder joints than the differences in CTE between an IC and a circuit substrate.

Connectors attached to circuit substrates via solder ball techniques are also more susceptible to joint stress than a conventional SMT attachment technique. For example, a conventional SMT attaches connector terminal tails to a circuit substrate horizontally, providing more attachment surface area for the solder joint. The additional surface area of the solder joint in the conventional SMT technique is stronger and, consequently, more tolerant of differences in CTE between the connector, terminal tails and circuit substrate. A solder ball connection, on the other hand, attaches a connector terminal tail vertically to the circuit substrate with the end of the terminal tail directly mated to the circuit substrate, reducing the amount of attachment surface area. As a result of the smaller attachment surface, differences in CTE are much more likely to stress the terminal tail to circuit substrate joint resulting in failure or quality problems.

Furthermore, in most circuit substrate applications, the electrical component mounting surfaces of the surface mount connections must meet strict coplanarity requirements. Thus, the use of solder balls to attach a connector to a circuit substrate imposes the requirement that the solder balls are coplanar in order to ensure a substantially flat mounting interface. So that, in the final application the balls will reflow and solder evenly to a planar circuit substrate. Any significant differences in solder coplanarity on a given mounting connection can cause poor soldering performance when the connector is reflowed onto a printed circuit board. Accordingly, users specify very tight coplanarity requirements to achieve high soldering reliability, on the order of 0.1 to 0.2 mm for example. By providing a connection using a solder ball technique, the coplanarity requirements can be met and sometimes exceeded. Unlike conventional SMT, the solder ball can absorb variations in terminal tail length by changing shape upon the application of heat to bridge the gaps between the terminal tail ends and the circuit substrate connections.

The present invention recognizes that there is a need for an improved electrical connector apparatus and accompanying electrical connector construction techniques that address the shortcomings of present electrical connectors.

SUMMARY OF THE INVENTION

The invention meets the above needs by providing an improved electrical connector for use in forming an electrical connection between a contact portion of an electrical component and a contact portion of a circuit substrate and method for constructing the electrical connector. The electrical connector comprises a connector body, a plurality of electrical contacts disposed on the connector body arranged to electrically mate with the contact portion of the electrical component, a plurality of electrical elongated conductors, alternately referred to as terminal tails, disposed on the connector body are arranged to form an electrical connection with the circuit substrate. The elongated conductors are in electrical communication with corresponding electrical contacts. A substrate contact, such as a solder ball, is connected via a butt joint on an end of each of the elongated conductors such that an electrical connection between the elongated conductors and the contact portion of the circuit substrate is selectively accommodated.

Each of the elongated conductors is disposed in a passage that has cross-sectional diameter a little larger than the cross-sectional diameter of the elongated conductor. As a result, clearance is provided between the sides of the electrical conductor and the side walls of the passage. Preferably, the cross-section is substantially rectangular in shape. The passages terminate in wells that are disposed across a planar face of the connector. The wells have a rectangular top opening that is longer along a length of the connector face. Moreover, a portion of the connector body proximate the elongated connector tail end is coated with an antimigration solution such as oleophobic-hydrophobic flourochemical polymer to assist the process of solder ball formation and attachment.

One of the primary manufacturing challenges in manufacturing the above described connector involves the method of fusing substrate contact material (e.g., a solder ball) to the end of the tail portion of the elongated conductors. The invention accomplishes this attachment task by first forming a well, as described above, within a planar surface of the conductor. Here, the planar surface is provided by an interface member that can be formed separately and attached to the body of the connector or alternatively formed as an integral component with the body. In either case, the tail ends of the elongated conductors are inserted into passages formed in the interface member such that the tail ends terminate within a predefined range of the mounting surface and are exposed within the well. The well is then filled with a predetermined amount of solder paste. Finally, the substrate contacts are fused to the ends of the elongated conductors according to two embodiments.

In the first embodiment, a premanufactured substrate contact member such as a solder ball is seated into the paste. The tail end, substrate contact member and solder paste are then heated to a predefined temperature above the melting point of the paste such that the solder paste coalesces around the substrate contact member and joins it to the elongated conductor end.

According to a second embodiment, no premanufactured substrate contact member is used. Rather, a pre-specified amount of solder paste is applied to the well. Thereafter, the tail end and solder paste are heated to a predefined temperature, above the melting point of the solder paste. As a result, the solder paste coalesces into a ball attached to the end of the elongated conductor.

The process for forming a substrate contact on an elongated conductor as described above is further enhanced by coating the well with an anti-migration solution such as oleophobic-hydrophobic fluoropolymer. Thereafter, when the solder paste is heated, the paste is repelled from the treated surfaces of the well and interface member. This results in a more uniform ball formation. The substrate contact attachment process can be further enhanced by passivating a portion of the tail end such that solder paste will not attach to the passivated portion. As a result, the solder can attach only to the very end of the elongated conductor. Solder flow restriction at the tail end can be enhanced by passivating the tail end, coating the tail end with an anti-migration solution or both.

BRIEF DESCRIPTION OF THE DRAWINGS

Other uses and advantages of the present invention will become apparent to those skilled in the art upon reference to the specification and the drawings, in which:

FIG. 1 is a top plan view of a card edge connector which represents a preferred embodiment of the connector of the present invention;

FIG. 2 is a front view of the card edge connector shown in FIG. 1;

FIG. 3 is a side view of the card edge connector shown in FIG. 1;

DETAILED DESCRIPTION OF THE PREFERRED EMBODIMENTS

Figure 4:
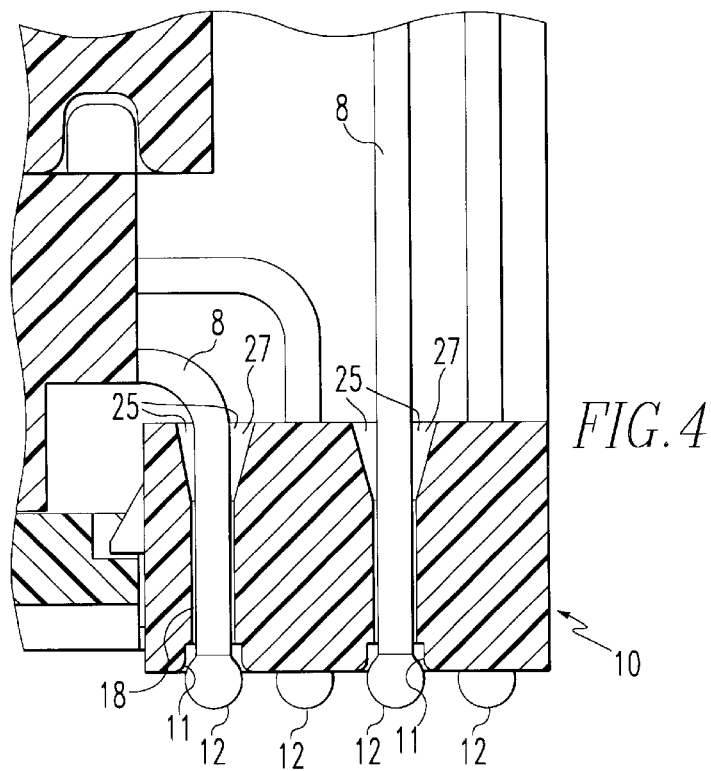
FIG. 4 is an cross-sectional view through 4—4 in FIG. 1.

According to presently preferred embodiments, a linear connector having a solder ball type electrical contact surface and methods for attaching the solder balls to the connector will now be described with reference to the Figures. It will be appreciated by those of ordinary skill in the art that the description given herein with respect to those Figures is for exemplary purposes only and is not intended in any way to limit the scope of the invention. For example, an electrical connector is described herein having a substantially rectangular mounting surface wherein the length of the mounting surface is substantially greater than its width. However, the particular dimensions described herein with reference to that connector are merely for the purpose of illustration and are not intended to be limiting. The concepts disclosed herein have a broader application to a much wider variation of connector mounting surface geometries. The concepts disclosed with reference to this connector could be employed, for example, with a connector having a connection mounting surface having a more square or radial geometry.

Referring now to FIGS. 1–3, there is shown top, front and side views, respectively, of an electrical connector 1 of the present invention. As shown, connector 1 comprises a connector body 5, a plurality of elongated conductors 8, an interface member 10, electrical element contacts 9, hold down element 13 with an upwardly extending arm 15 and connector latches 24. As best shown in FIG. 2, the front of connector 1 comprises a plurality of electrical contacts 9 arranged within two openings, which are designed to selectively engage and mate with corresponding electrical contacts for an electrical element such as those electrical contacts present on a daughter board. As is described in further detail below, each electrical contact 9 is in electrical communication with a corresponding elongated conductor 8 such that a current flow path is established therebetween. Elongated conductors 8 are designed for permanent connection to electrical contacts on a circuit substrate (not shown). Thereafter, electrical communication can be selectively established between an electrical element inserted into electrical connector 1 and a circuit substrate to which it is attached. In this way, for example, electrical connector 1 can be connected to a circuit substrate such as a card edge connector of the type used in a computer motherboard. Thereafter, a user, via attached electrical connector 1, can selectively add a daughter board or boards (e.g., memory modules) to the computer motherboard.

The electrical contacts of connector 1 comprise a linear array stacked in two parallel rows 36A and 36B, each row accepting a single daughter board. A user inserts an electrical element laterally into connector 1. As each daughter board is inserted, connector latches 24 that correspond to the particular row, 36A or 36B, engage and lock the electrical element into place on connector 1. Although two parallel rows are shown with respect to connector 1, the concepts disclosed herein are equally applicable to a connector having one row, three rows and so on. Preferably, connector body 5 and connector latches 24 are constructed from a molded plastic material to reduce weight.

Figure 5:
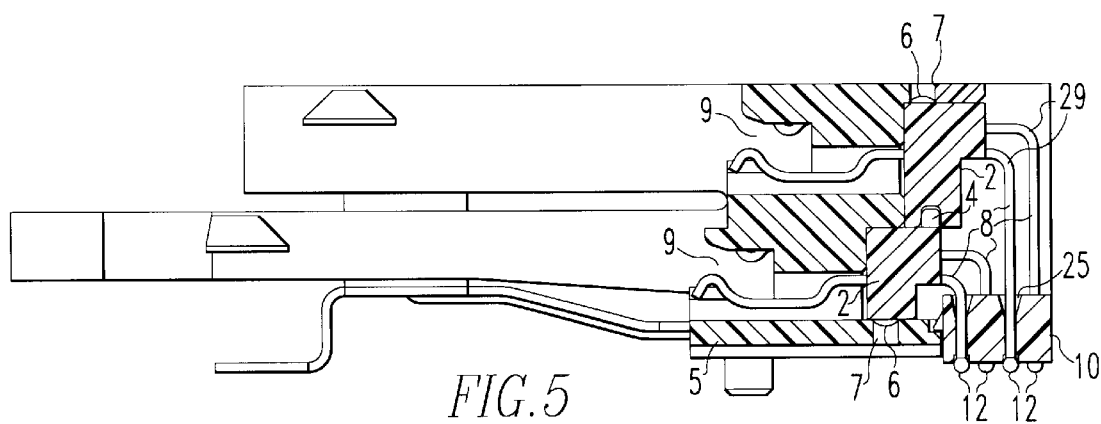
FIG. 5 is a detailed view of the substrate contact area of FIG. 4.

Further details of the arrangement of connector 1 can be seen with reference to FIG. 4. FIGS. 4 and 5, presents a cross-sectional view of connector 1 taken along the line 4—4. As shown therein, connector 1 further comprises stacked insert molded wafers 2, which are locked together in a pin and socket arrangement 4. Thus locked together, wafers 2 are retained in housing 5 by a series of dimples 6 which are fitted into cylindrical openings 7. A plurality of elongated conductors 8 extend into each of wafers 2. Each elongated conductor therein joins in electrical communication with a corresponding electrical contact 9. Each elongated conductor 8 also extends out from wafer 2 and extends down into interface member 10. A bend 29, preferably about 90° in the disclosed embodiment, along with the length of elongated conductor 8 allows connector 1 to provide interfaces on two different planes. For example, the bend allows connector 1 to interface vertically with respect to the board, while interfacing with an electrical element that is positioned horizontally with respect to the board. As such, the electrical element projects horizontally over the circuit substrate surface conserving circuit substrate height. Other degrees of bends 29 could be used as required to adjust to a variety of application geometries without departing from the inventive aspects of the present invention. For example, the elongated conductors could have no bend, in which case, the electrical element would project vertically with respect to the circuit substrate. The tail end of each elongated conductor 8 extends through a corresponding passage 25 in interface member 10 and is terminated by a substrate contact 12 such as a solder ball. Each elongated conductor 8 preferably has a substantially rectangular cross-sectional shape such as a square; however, other cross-sectional shapes such as round may function equally as well.

FIG. 5 presents a more detailed view of elongated conductors 8 in relation to interface member 10. Interface member 10 can be a separate component that is attached to connector body 5 or, alternatively, could be integrally formed therewith. As shown, interface member 10 has a plurality of passages 25, one passage 25 being provided to guide and support one elongated conductor 8 with a tail end of each elongated conductor 8 disposed within a passage 25. Significantly, the diameter of passage 25 is a little larger than the diameter of elongated conductor 8. Accordingly, the tail end of elongated conductor 8 is disposed within passage 25 such that clearance 18 is provided between the sides of elongated conductor 8 and the walls of passage 25. For example, whereas elongated conductor 8 has a width of about 0.305 mm, passage 25 has a width of about 0.38 mm. Clearance 18 provides an important feature in tolerating differences in Coefficients of Thermal Expansion (CTE) between the material forming the interface member 10 and the material forming the circuit substrate on which the connector is mounted. That is, passages 25 are sized to provide guidance to elongated conductors 8 during substrate contact 12 attachment and further during connector 1 attachment to a circuit substrate. However, elongated conductors 8 have a clearance with and are not physically connected to interface member 10, permitting interface member 10 to expand and contract without the side walls of the passages impinging upon elongated conductors 8 because of the clearance. The amount of clearance is related to the differential in CTE noted above. As a result, stress is reduced in a solder joint between elongated conductors 8 and the circuit substrate during thermal expansion and contraction cycles. Passage 25 preferably comprises a cross-section substantially similar to the cross-section of elongated conductor 8. For example, if elongated conductor 8 has a substantially rectangular cross-section then passage 25 also has a substantially rectangular cross-section. Each passage 25 terminates in the bottom of well 11 and comprises a wide inlet cavity 27 that provides guidance to elongated conductor 8 during insertion into interface member 10. Each end of a conductor 8 terminates within well 11 and therein is fused to a substrate contact 12, which is also partially disposed within well 11. For a variety of reasons, including the bend in elongated conductors 8, the termination height of the elongated conductors 8 within wells 11 will vary among conductors 8. This height variation is commonly referred to as coplanarity.

Figure 8:
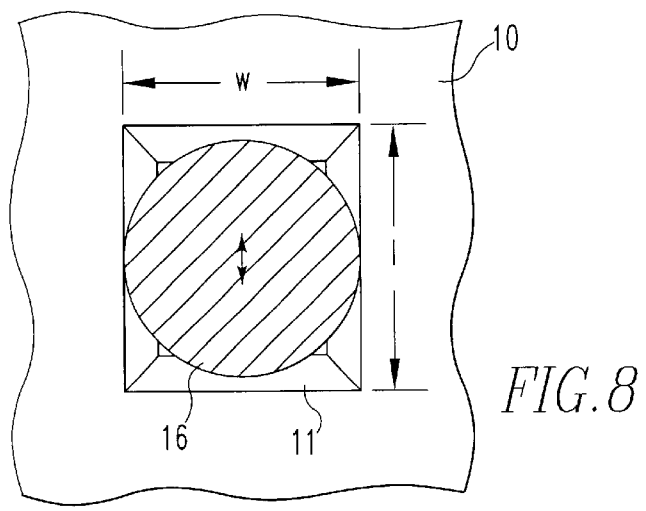
FIG. 8 is a bottom plan view of a substrate contact connection.

Referring now to FIG. 8, a bottom plan view of a substrate contact 12 in relation to well 11 is depicted. As shown, well 11 is substantially rectangular in cross-section having a length 1 slightly larger than a width w. For example, width w is preferably 0.5 mm; whereas, length 1 is preferably 0.55 mm. Additionally, according to a first embodiment, substrate contact 12 is on the order of 0.3 mm to 0.5 mm. Thus, there is a clearance of at least about 0.05 mm between substrate contact 12 and two sides of well 11. As with passages 25, the rectangular shape of well 11 also accommodates effects of thermal expansion and contraction. The clearance between the sides of well 11 and substrate contact 12 ensures that well 11 will not impinge upon the solder joint during expansion and contraction.

The length of well 11 is aligned with the length of interface member 10 to accommodate thermal cycles while maximizing conductor 8 density. Because interface member 10 is longer along its length than its width, the effects of expansion and contraction will be correspondingly greater along the length of interface member 10 than along the width. Accordingly, a top opening of well 10 has dimensions that accommodate the lengthwise thermal expansion and contraction. Along the width of interface member 10, the effects of expansion and contraction are less of an issue because of the smaller size relative to the length. Consequently, the width of well 11 can be narrower than the length. The overall result is a well 11 that is sized to accommodate expansion and contraction along the length of connector 1 while allowing a higher density of wells 11 and conductors 8 along the width of connector 1. Additionally, because the top opening of well 11 is dimensioned in this way, tighter elongated conductor 8 densities across the width of interface member 10 are possible while allowing well 11 to maintain a required volume of solder paste during substrate contact attachment.

Figure 6:
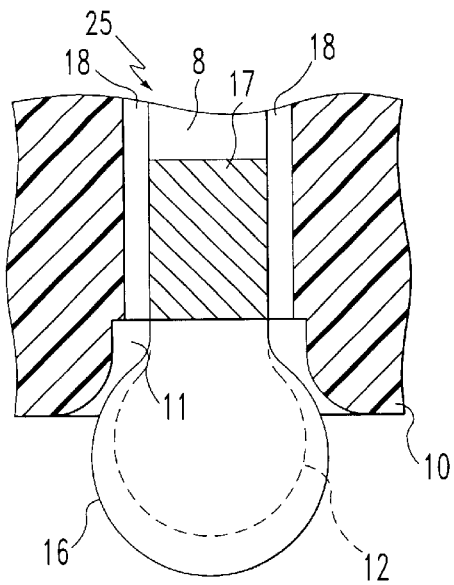
FIG. 6 is a schematic cross-sectional view of completed substrate contact connection to a first tail end embodiment.

Further details of the connection of substrate contacts 12 to elongated connectors 8 will now be described with reference to FIGS. 6–9. Referring now to FIG. 6, an embodiment of the attachment of substrate contact 12 to end of the elongated conductor 8 is shown. The substrate contact 12 is fused to the end of elongated conductor 8 with a butt joint. To ensure a quality butt joint between substrate contacts 12 to elongated conductors 8, a portion of the tail end of each elongated conductor 8 has a passivated surface 17. Passivated surface 17 ensures that solder, used during the attachment process, does not wick along the sides of elongated conductor 8 and potentially enter clearance 18 during substrate contact reflow. As described above, clearance 18 accommodates differences in Coefficients of Thermal Expansion. Accordingly, if solder enters clearance 18, the reliability of a corresponding solder joint is jeopardized as interface member 10 expands and contracts. Therefore, an anti-solder wicking or non-solder wettable material is applied to the surface 17. One preferred material for this purpose is nickel plating. While not intending to be bound by any particular theory, it is believed that the solder resistant feature of this nickel plated area results from or is enhanced by the oxidation of the nickel plating, for example, by laser oxidation, steam exposure or ambient air exposure. Other solder wick resistant materials are believed to be useable for this purpose, such as fluorine containing solder resist coatings. Alternatively, a combination of nickel and fluorine could be used.

Figure 7:
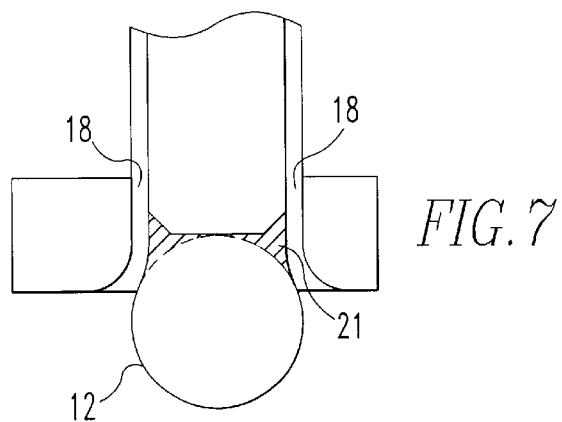
FIG. 7 is a schematic cross-sectional view of a completed substrate contact connection to a first tail end embodiment.

Other embodiments are possible to prevent solder wicking. For example, FIG. 7 depicts a second embodiment of the substrate contact and elongated conductor 8 interface. In this embodiment, the end of elongated conductor 8 is beveled. As a result of the bevel, solder filet 21 is formed between substrate contact 12 and the end of elongated conductor 8 during the attachment of substrate contact 12 to elongated conductor 8. This second embodiment also reduces the potential for solder to wick into the clearance 18 by capturing solder within a bevel.

Figure 9:
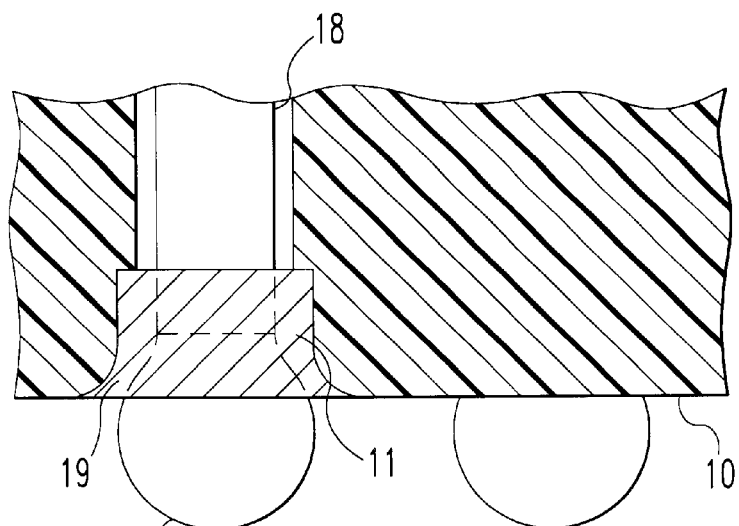
FIG. 9 is a schematic cross-sectional view of a substrate contact connection according to a first method.

In the embodiments previously described, the tail end of each elongated conductor 8 is positioned in a well 11. Each well 11 is substantially uniform in size and shape and provides several features of importance with respect to the present invention. Referring to FIG. 9, for example, each well 11 ensures that a highly uniform amount of solder paste 19 is received therein using a process such as a simple deposit and squeegee operation. Thus, the amount of solder available for securing each substrate contact onto an end of elongated conductor 8 is substantially uniform. The wells 11 locate the position of each substrate contact in the lateral X-Y directions prior to attachment of the substrate contacts in the Z direction with respect to the bottom surface of interface member 10 and the end of elongated conductor 8. After solder reflow and best shown in FIG. 6, the solder contained in paste 19 in well 11 increases substrate contact 12 size by area 16.

The size of area 16 is affected by the height of the tip of conductor 8 within well 11. The amount of solder paste deposited in each well 11 is altered by the variation in elongated conductor 8 height. For example, a conductor 8 tip that is higher in well 11 will displace more solder paste; whereas, a conductor 8 tip that is lower in well 11 will displace less solder paste. If less paste is available in the well, during reflow of the solder paste less paste is available to coalesce around the substrate contact, resulting in a slightly smaller substrate contact 12. A smaller substrate contact will result in a lower height. On the other hand, when more paste is available in the well a larger substrate contact will result, corresponding to a higher substrate contact height.

Figure 10:
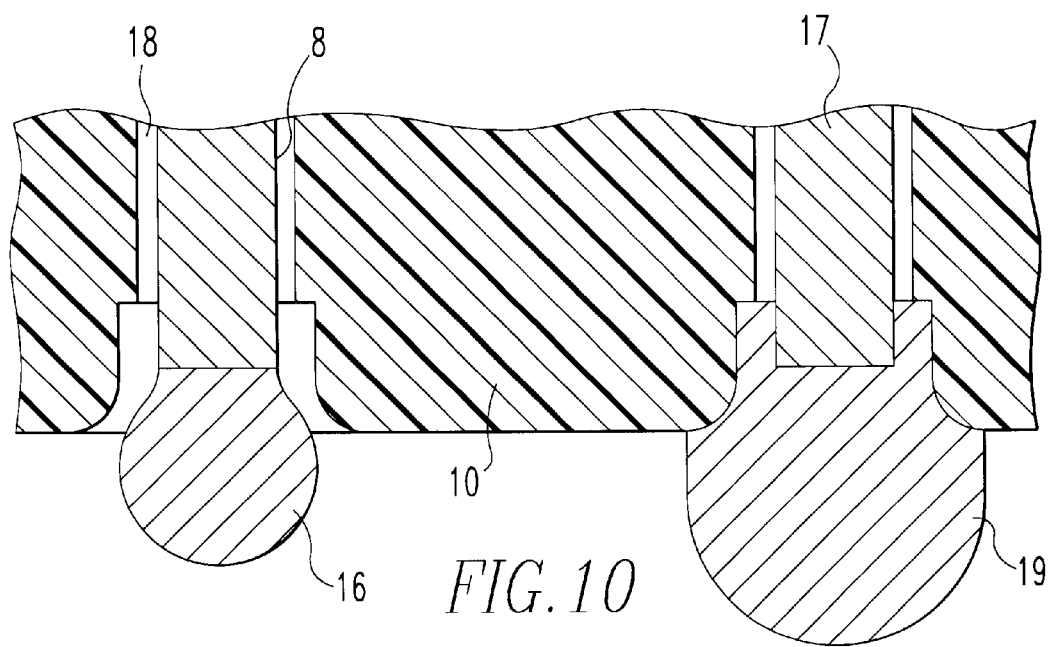
FIG. 10 is a schematic cross-sectional view of a substrate contact connection according to a second method.

The process above describes a substrate contact attachment via the use of preformed substrate contacts 12. However, according to a second embodiment, the substrate contact interface can be formed without the use of preformed substrate contacts. Referring now to FIG. 10 there is shown a method of substrate contact 12 attachment using only solder paste. According to this method, a prespecified amount of solder paste is deposited in and over well 11. This prespecified amount of solder paste can be deposited by a commercial dispensing machine such as a CAM/A LOT 1818 available from Camelot Systems, Inc. After the solder paste deposition, the connector is heated above the solder paste melting point. The solder within the paste then coalesces into a substrate contact 12, which forms on the end of elongated conductor 8. As described above with reference to the preformed substrate contact technique, the variable volume of paste will effect the size and coplanarity of the substrate contacts. Similar to the preformed substrate contact method, the displacement of solder paste by the height of conductor 8 within well 11 will affect the final coplanarity in this method as well.

As previously mentioned, coplanarity of the substrate mounting face of a connector utilizing substrate contact mounting is critical with any SMT device. In connector 1, there are two primary factors that influence the coplanarity of the connector to circuit substrate interface: (1) the coplanarity of the end surfaces, i.e., the tips, of elongated conductors 8; and (2) the coplanarity of substrate contacts 12. The coplanarity of the tips of elongated conductors 8 is affected by a variety of factors such as length of the conductor 8, uniformity of the bends, the ability to keep the conductors consistently parallel and the like. As a result, it is extremely difficult to maintain the conductor tips within the final coplanarity requirement of the circuit substrate manufacturers while maintaining high yields and low costs. As described more fully below, however, through the use of the substrate contact attachment in connection with well 11, the restrictive coplanarity requirements for the completed connector 1 is met while imposing a less restrictive coplanarity requirement on the tips of elongated conductors 8.

Figure 11:
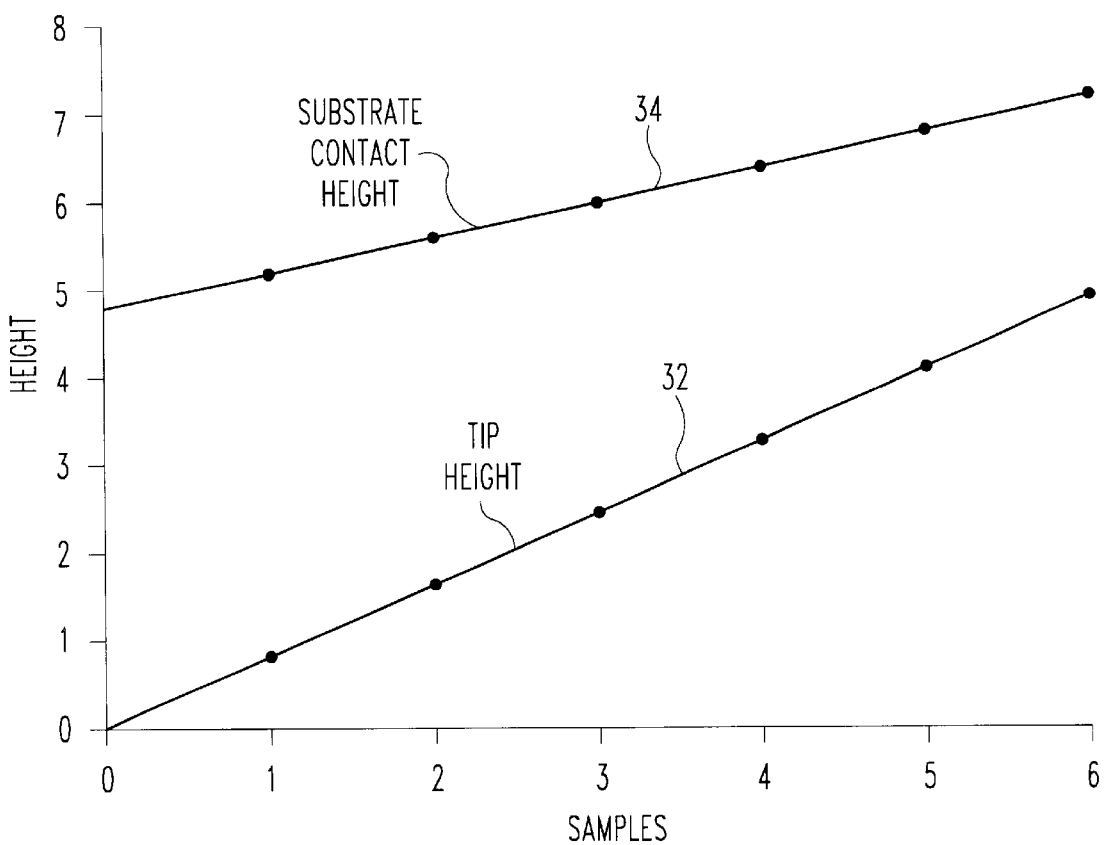
FIG. 11 is a graph comparing relative terminal tail height versus substrate contact height.

Referring to FIG. 11, there is shown an exemplary graph of the coplanarity of the tips of elongated conductors 8 before the attachment of substrate contacts 12 (curve 32) versus the coplanarity of elongated conductors 8 with the attached substrate contacts 12 (curve 34). The units along the abscissa represents different samples used in the coplanarity measurement. The units along the ordinate represent unit sample height labeled 0, 1, 2 and so on; however, these units are labeled to merely illustrate the relative relationship between the tip position and corresponding substrate contact height. Actual units and values will vary depending on factors such as well dimensions and substrate contact size.

Curve 32 represents the height of an elongated conductor tip as measured above the bottom of well 11 (see also FIG. 6). Thus, at sample 0, for example, the measured tip height is 0 units. At sample 1, the tip height is about 0.75 and so on. At sample 5, the tip height is about 4 units.

Curve 34 represents the height above the bottom of well 11 of the same tip after attachment of the substrate contact 12 (see also FIG. 6). For sample 0, the corresponding height after attachment of substrate contact 12 is about 4.5 units. At sample 1, the corresponding substrate contact height is about 5 units and so on. Finally, for sample 5, the substrate contact height is about than 6.5 units.

Comparing the curves 32 and 34 illustrates that the process of attaching substrate contact 12 to the end of conductor 8 absorbs some of the variations in coplanarity of the tips of conductors 8. For example, in sample 0, the difference between the tip height (preattachment curve 32) and the substrate contact height (post attachment curve 34) is about 4.5 units. By contrast, at sample 5, the tip height is about 4 units, whereas the substrate contact height is about 6.5 units, for a difference of only 2.5 unit. Moreover, the total change in tip height over the enter range of samples was about 4 units, but the total change of substrate contact height over the same sample range was only about 2 units.

To further illustrate the coplanarity regulation performed by the wells consider the following example. A typical connector before substrate contact attachment will have a number of elongated conductors 8 with different tip heights. If, for example, one conductor 8 has a tip height of 0 (i.e., the tip is exactly flush with the bottom of the well) and another connector has a tip height of 4 units, the coplanarity between the tips would be about 4 units. Under some circumstances this coplanarity variation of 4 units may be unacceptable. However, after the attachment of substrate contacts 12 according to the methods described herein, the corresponding substrate contact heights will be 4.5 units and 6.5 units respectively, for a final coplanarity of about 2 units. Significantly, the final coplanarity is only 2 units versus 4 units.

In summary, the coplanarity differences of the tips of elongated conductor 8 is counteracted during the attachment of substrate contacts 12. Substrate contact size is transformed by the variable volume of solder paste placed in well 11 as a result of variations in heights of elongated conductor tips. Consequently, the overall height of the substrate contact after attachment to the tip of conductors 8 is somewhat equalized. Accordingly, a connector 1 can be constructed with a higher tolerance for elongated conductors coplanarity than would be possible otherwise.

According to another aspect of the invention, the quality of substrate contact 12 attachment is enhanced by the application of an anti-migration or anti-wicking solution to an area in and around well 11. Without the anti-migration solution, substrate contacts may form unevenly, sometimes wicking to the well edges. With the anti-migrations solution applied, solder is repelled from the well edges and forms more uniform substrate contacts on the ends of elongated conductors 8. The preferred anti-migration solution is oleophobic-hydrophobic fluoropolymer. Such a solution is commercial available from 3M corporation under the Fluorad brand name.

In the method of this invention, the substrate contact will preferably be a solder ball. Those skilled in the art, however, will appreciate that it may be possible to substitute other fusible materials which have a melting temperature less than the melting temperature of conductor body 5 and elongated conductors 8. The fusible element can also have a shape other than a sphere. The ends of elongated conductors 8 will extend into well 11 by a sufficient amount to present adequate surface area for the substrate contact to fuse to, and will usually preferably extend into the recess from about 25 percent to 75 percent and more preferably to about 50 percent of the depth of the recess as previously mentioned. The recesses ordinarily will be circular, square or the shape of any other regular polygon in cross-section. When the conductive element is solder, it will preferably be an alloy which is in the range of about 3% Sn and 97% Pb to about 100% Sn and 0% Pb. More preferably the alloy will be eutectic which is 63% Sn and 37% Pb and has a melting point of 183° C. Typically, a "hard" solder alloy with a higher lead content would be used for mating to materials such as ceramics. The "hard" substrate contact will "mushroom" or deform slightly as it softens under typical SMT conditions, but will not melt. A "soft" eutectic ball is used for attachment to printed circuit boards and will usually reflow and reform itself under typical SMT conditions. Other solders known to be suitable for electronic purposes are also believed to be acceptable for use in this method. Such solders include, without limitation, electronically acceptable tin-antimony, tin-silver and lead silver alloys and indium. Before the substrate contact or other conductive element is positioned in a recess, that recess would usually be filled with solder paste.

Alternatively, in place of the substrate contact previously described, a body of material which is not fusible at SMT temperatures may be attached by reflow of the solder paste in the recesses onto the contacts. The connector mounting interface would comprise a plurality of infusible spheres in a tightly coplanar array. Such a connector would be secured on a substrate by conventional SMT techniques.

While it is believed that a solder paste or cream incorporating any conventional organic or inorganic solder flux may be adapted for use in this method, a no clean solder paste or cream is preferred. Such solder pastes or creams would include a solder alloy in the form of a fine powder suspended in a suitable fluxing material. This powder will ordinarily be an alloy and not a mixture of constituents. The ratio of solder to flux will ordinarily be high and in the range of 80%–95% by weight solder or approximately 50% by volume. A solder cream will be formed when the solder material is suspended in a rosin flux. Preferably the rosin flux will be a white rosin or a low activity rosin flux, although for various purposes activated or superactivated rosins may be used. A solder paste will be formed when a solder alloy in the form of a fine powder is suspended in an organic acid flux or an inorganic acid flux. Such organic acids may be selected from lactic, oleic, stearic, phthalic, citric or other similar acids. Such inorganic acids may be selected from hydrochloric, hydrofluoric and orthophosphoric acid. Cream or paste may be applied by brushing, screening, or extruding onto the surface which may advantageously have been gradually preheated to ensure good wetting.

Heating is preferably conducted in a panel infra red (IR) solder reflow conveyor oven. The connector would then be heated to a temperature above the melting point of the solder within the solder paste.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method of making an electrical connector assembly comprising the steps of:

providing an electrical connector with a housing and at least one contact, said contact having a tail extending from said housing;

providing an auxiliary housing having an opening therethrough;

placing a fusible material in said opening at a first side of the auxiliary housing;

inserting said tail into said opening; and fusing said fusible material to said tail, wherein after said fusible material is fused to said tail, said fusible material extends out of said opening at said first side for subsequent reflow fusing to another electrical member positioned at said first side.

2. The method as recited in claim 1, further comprising the step of placing a formed element in said fusible material and wherein said fusing step includes fusing said formed element to said tail.

3. The method as recited in claim 1, further comprising the step of maintaining said tail away from a side of said opening.

4. The method as recited in claim 1, further comprising the step of preventing migration of said fusible material.

5. The method as recited in claim 4, wherein the preventing step comprises the step of treating one of said tail and said opening with an anti-migration solution.

6. The method as recited in claim 1, wherein the placing step comprises introducing a solder paste in said opening.

7. A method of making an electrical connector assembly comprising the steps of:

providing an electrical connector with a housing and at least one contact, said housing having an opening therethrough;

placing a fusible material in said opening;

inserting a tail of said at least one contact into said opening;

fusing said fusible material to said tail; and preventing migration of said fusible material.

8. The method as recited in claim 7, wherein the preventing step comprises the step of treating one of said tail and said opening with an anti-migration solution.

9. A method of making an electrical connector comprising steps of:

providing a first subassembly comprising a first housing and at least one electrical conductor connected to the first housing, said conductor having an end;

connecting a second housing to the first subassembly, wherein the conductor extends into an opening in the second housing, through a first side of the second housing, and into an enlarged well of the opening along a second different side of the second housing;

placing fusible material in the enlarged well and on the conductor in the well; and fusing the fusible material to the end of conductor, wherein after fusing the fusible material extends out of the well for subsequent reflow fusing with another member placed at the second side of the second housing.

10. The method as recited in claim 9, further comprising preventing migration of the fusible material.

11. The method as recited in claim 10, wherein the preventing step comprises treating the end of the conductor with an anti-migration solution.

12. The method as recited in claim 10 wherein the preventing step comprises treating the opening with an anti-migration solution.

13. The method as recited in claim 11 wherein the step of inserting said tail into said opening includes keeping a distal end of said tail within said auxiliary housing.

14. The method as recited in claim 7 wherein the step of providing the electrical connector includes providing an auxiliary housing, said opening being located in said auxiliary housing.

15. The method as recited in claim 7 wherein the step of inserting said tail into said opening precedes the step of fusing said fusible material to said tail.

* * * * *